United States Patent
Contini et al.

(10) Patent No.: US 9,897,631 B2
(45) Date of Patent: Feb. 20, 2018

(54) CURRENT SENSOR AND ELECTRIC NETWORK COMPRISING SUCH A CURRENT SENSOR

(71) Applicant: Schneider Electric Industries SAS, Rueil-Malmaison (FR)

(72) Inventors: Erick Contini, Meylan (FR); Pascal Houbre, Jarrie (FR); Michel Clemence, Chambery (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 0 days.

(21) Appl. No.: 15/011,952

(22) Filed: Feb. 1, 2016

(65) Prior Publication Data

US 2016/0223593 A1    Aug. 4, 2016

(30) Foreign Application Priority Data

Feb. 2, 2015 (FR) ...................................... 15 50784

(51) Int. Cl.
| | |
|---|---|
| *G01R 19/25* | (2006.01) |
| *G01R 15/18* | (2006.01) |
| *G01R 15/14* | (2006.01) |
| *G01R 31/07* | (2006.01) |
| *G01R 15/16* | (2006.01) |

(52) U.S. Cl.
CPC ......... *G01R 15/181* (2013.01); *G01R 15/142* (2013.01); *G01R 19/2513* (2013.01); *G01R 31/07* (2013.01); *G01R 15/165* (2013.01)

(58) Field of Classification Search
CPC ..... G01R 19/2513; G01R 31/07; G01R 21/06
See application file for complete search history.

(56) References Cited

U.S. PATENT DOCUMENTS

| | | | |
|---|---|---|---|
| 5,017,859 A | 5/1991 | Engel et al. | |
| 2005/0017054 A1* | 1/2005 | Iverson | H01F 27/2804 228/180.5 |
| 2005/0280423 A1 | 12/2005 | Barbour et al. | |
| 2007/0194797 A1* | 8/2007 | Ibuki | G01R 15/142 324/600 |
| 2008/0297162 A1* | 12/2008 | Bright | G01R 15/142 324/512 |

(Continued)

FOREIGN PATENT DOCUMENTS

| | | |
|---|---|---|
| EP | 2 136 216 A1 | 12/2009 |
| EP | 2 722 678 A1 | 4/2014 |

(Continued)

OTHER PUBLICATIONS

French Preliminary Search Report dated Nov. 27, 2015 in French Application 15 50784, filed on Feb. 2, 2015 (with English translation of Categories of Documents).

*Primary Examiner* — Huy Q Phan
*Assistant Examiner* — Dustin Dickinson
(74) *Attorney, Agent, or Firm* — Oblon, McClelland, Maier & Neustadt, L.L.P.

(57) ABSTRACT

A current sensor including a measurement torus, arranged in a casing positioned around an electric conductor able to transmit an electric current, and a device for detecting a voltage in the electric conductor. The detection device is configured for surrounding the electric conductor when the current sensor is installed.

9 Claims, 5 Drawing Sheets

(56) References Cited

U.S. PATENT DOCUMENTS

| | | | |
|---|---|---|---|
| 2010/0013632 A1* | 1/2010 | Salewske | G01R 19/2513 340/540 |
| 2010/0283487 A1 | 11/2010 | Juds et al. | |
| 2011/0089933 A1 | 4/2011 | Javora et al. | |
| 2011/0116197 A1* | 5/2011 | Zylstra | G01R 15/183 361/42 |
| 2012/0019267 A1* | 1/2012 | Tabuchi | G01R 15/18 324/686 |
| 2013/0154629 A1* | 6/2013 | Gudel | G01R 15/185 324/225 |
| 2013/0214765 A1* | 8/2013 | Javora | G01R 15/181 324/114 |

FOREIGN PATENT DOCUMENTS

| | | |
|---|---|---|
| FR | 2 912 512 A1 | 8/2008 |
| WO | WO 2010/128385 A1 | 11/2010 |
| WO | WO 2013/026423 A1 | 2/2013 |
| WO | WO 2013/135506 A1 | 9/2013 |

\* cited by examiner

CURRENT SENSOR AND ELECTRIC NETWORK COMPRISING SUCH A CURRENT SENSOR

The present invention relates to a current sensor, as well as to an electric network comprising such a current sensor.

In the field of current distribution electric networks, in particular three-phased electric networks, a medium voltage-low voltage (MV-LV) transformer is the starting point for several branches of the electric network, notably three-phased branches. Each branch is generally equipped with one or several protective devices, notably fuses and circuit breakers. In particular, three conductors of one branch are each equipped with a fuse at the transformer and with a circuit breaker downstream.

It is desirable to monitor these protective devices and in particular it is desirable to detect the melting of one of the fuses of the branch. Indeed, the fuses positioned at the output of the transformer, may melt under the effect of significant over-intensity which would not be removed by one of the circuit breakers installed downstream. Further, it is important to be able to discriminate the cause of the melting of a fuse, to recommend a backup scenario and to avoid a false alert on the electric network.

To do this, it is known how to monitor an electric current transmitted by the electric network. Such an approach provides the installation of a current sensor, notably a Rogowski torus, on each conductor of the branch, in order to measure the electric current flowing in this conductor. The measurement of the electric current is thus associated with the use of one or several algorithms giving the possibility of inferring the condition of the fuse. The analysis of the melting of the fuse by the measurement of the electric current has several risks, notably a non-detection of the melting of the fuse or a false alert caused by the suppression of a load or the opening of a circuit breaker downstream.

On this subject, it is also known how to monitor the fuses by detecting in the conductors a downstream voltage. In particular, as described by FR-A-2 991 057, it is known how to equip a current sensor with means for detecting the voltage on the terminals of the Rogowski torus. However, in branches of three-phased networks, each sensor is subject, at the terminals of the torus, to a parasitic voltage induced by neighboring conductors. Further, always because of the induction of the parasitic currents, a voltage may be detected downstream from a molten fuse.

The following documents are also known: EP 2136 216 A1, EP 2 722 678 A1, US 2005/280423 A1, WO 2013/026423 A1, FR 2 912 512 A1, WO 2013/135506, WO 2010/128385 A1 and U.S. Pat. No. 5,017,859 A1.

These are the drawbacks which the invention more particularly intends to remedy by proposing a novel current sensor which allows detection of the downstream voltage of a fuse in a reliable way.

With this idea, the invention relates to a current sensor comprising a measurement torus, arranged in a casing positioned around an electric conductor able to transmit an electric current. The current sensor also comprises means for detecting a voltage in the electric conductor. According to the invention, the detection means are configured for surrounding the electric conductor when the sensor is installed, the voltage detection means comprising a measurement strip positioned at a non-zero distance from the electric conductor and a shielding which defines an electric ground of the detection means, the voltage detection means further comprising a comparison circuit electrically connected to the measurement strip.

By means of the invention, the current sensor by its detection means gives the possibility of substantially reducing the risks of non-detection as well as of a false alert.

According to advantageous but non-mandatory aspects of the invention, such a current sensor comprises one or several of the following features, taken according to any technically admissible combination:

The detection means comprise at least one circular capacitive electrode centered on a central axis of the current sensor.

A portion of the measurement strip is directly facing the electric conductor, without interposition of shielding and the shielding radially surrounds the measurement strip with respect to the central axis of the current sensor.

The comparison circuit comprises an analog comparator configured for comparing a detection detected by the measurement strip with a predetermined analog threshold.

The comparison circuit comprises an analog-digital convertor configured for transmitting a voltage detected by the measurement strip to an external microprocessor equipped with a predetermined digital threshold.

The measurement strip is a metal track adhesively bonded to the inside of the casing of the current sensor or a conductor surrounded by an insulating sheath.

The shielding is formed by a metallization layer affixed on an inner surface of the casing of the current sensor or is an over-molded plate inside the casing.

The invention also relates to an electric network including three electric conductors, each conductor being able to transmit a corresponding phase of an electric current and equipped with a current sensor. The electric network also includes a remote control unit equipped with a microprocessor adapted for receiving a result of at least one comparison. According to the invention, the current sensor is as described above.

According to a particular embodiment, the electric network is such that the threshold of the comparison circuit of each sensor is determined as the average between a first threshold value defined according to the electric conductor which surrounds it and a second threshold value defined according to the two adjacent electric conductors.

The invention will be better understood and other advantages thereof will become more clearly apparent in the light of the description which follows, only given as a non-limiting example and made with reference to the appended drawings, wherein.

Figure 1:
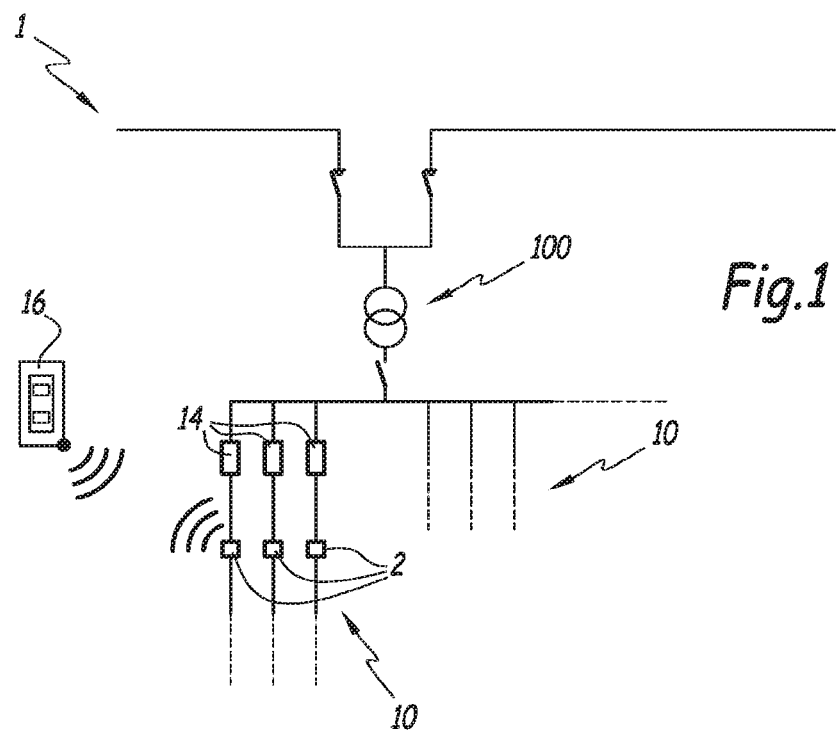
FIG. 1 is a schematic illustration of an electric network according to the invention, each conductor being equipped with a current sensor according to the invention.
Figure 2:
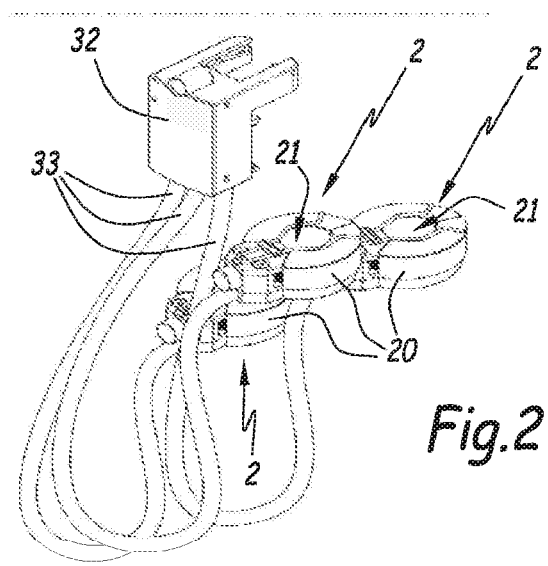
FIG. 2 is a perspective view of three current sensors according to the invention electrically connected to an external unit.

In FIG. 1, a three-phase electric network 1 is configured for transmitting an electric current. The network 1 is equipped with a transformer 100, such as a MV-LV transformer (medium voltage-low voltage). The transformer 100 is a source of an electric current supply for three-phased branches 10 positioned downstream from the transformer 100. Each branch 10 includes three electric conductors 12, each able to transmit a corresponding phase of the electric current circulating in the three-phase electric network 1.

Each conductor 12 includes, immediately downstream from the transformer 100, a first protective device 14, such as a fuse, which has the function of protecting the corresponding conductor 12 from an electric overload. In a way known per se, the fuse 14 is configured in order to melt and generate an interruption in the electric conductor 12 when a courant with an intensity greater than a given value flows in the conductor 12 for a predetermined time. Each conductor 12 of the branch 10 also includes a second protective device, such as an electric circuit breaker, installed downstream on the conductor 12. For the clarity of the drawings, the electric circuit breakers are not illustrated.

Each conductor 12 of the branch 10 is equipped, downstream from the fuse 14, with a current sensor 2. Each current sensor 2 comprises a casing 20 which is circular and thus positioned around the corresponding conductor 12. Each casing 20 defines a circular orifice 21 for letting through a conductor 12, aligned on an axis X2 which is a central axis of the current sensor 2. In other words, the casing 20 surrounds the electric conductor 12 when the current sensor 2 is installed. The current sensor 2 also comprises a measurement torus 22, notably a torus of the Rogowski type, arranged in the casing 20. In a way known per se, the measurement torus 22 is configured for generating, by electromagnetic induction from the conductor 12 which surrounds it, an electric voltage between its terminals.

The current sensor 2 also comprises means 24 for detecting voltage configured for detecting a voltage in the conductor 12 downstream from the fuse 14. The detection means 24 are partly arranged in the casing 20 of the current sensor 2 and are thus configured for surrounding the conductor 12 when the sensor 2 is installed. In particular, the detection means 24 comprise a circular measurement strip 26, a comparison circuit 28 and circular shielding 30. The elements 26 and 30 are centered on the axis X2.

The measurement strip 26 is in metal and is able to be positioned at a non-zero distance D from the electric conductor 12. The distance D may vary, between a minimum value D1 and a maximum value D2, according to the diameter of the conductor 12, which may be coated with an insulating sheath not shown. Considering that the diameter difference between the conductor 12 and the orifice 21, the distance D may not be constant around the conductor 12.

Figure 5:
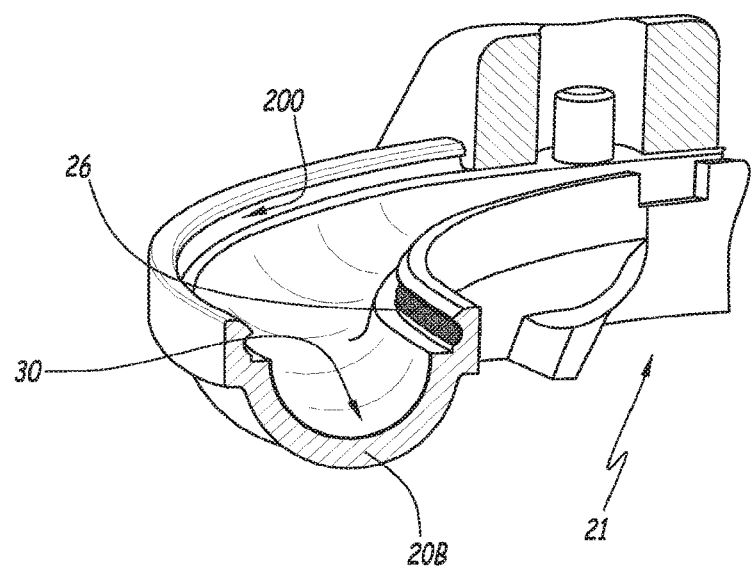
FIG. 5 is a sectional view, along the plane V in FIG. 4, of a casing of the current sensor of FIG. 4.

As visible in FIG. 5, the measurement strip 26 is a metal track which is adhesively bonded on an inner surface 200 of the casing 20 of the current sensor 2. The shielding 30 is formed by a metallization layer 30A and 30B affixed on the inner surface 200 of the casing. In practice, the casing 20 is formed with two half-shells 20A and 20B in synthetic material which are assembled around the measurement torus 22 and the shielding 30 comprises two portions 30A and 30B respectively positioned in the half-shells 20A and 20B and electrically connected with each other at a junction line 30C opposite to the strip 26 with respect to the measurement torus 22. The measurement strip 26 is positioned, radially with respect to the axis X2, inside the measurement torus 22. Thus, in an installed configuration of the measurement sensor 2 around the conductor 12, the strip 26 is positioned radially between the elements 12 and 22. The measurement strip 26 is the element of the means 24 which detects a voltage in the conductor 12 downstream from the fuse 14. This detection is achieved by electromagnetic induction of the conductor 12 on the measurement strip 26.

Figure 6:
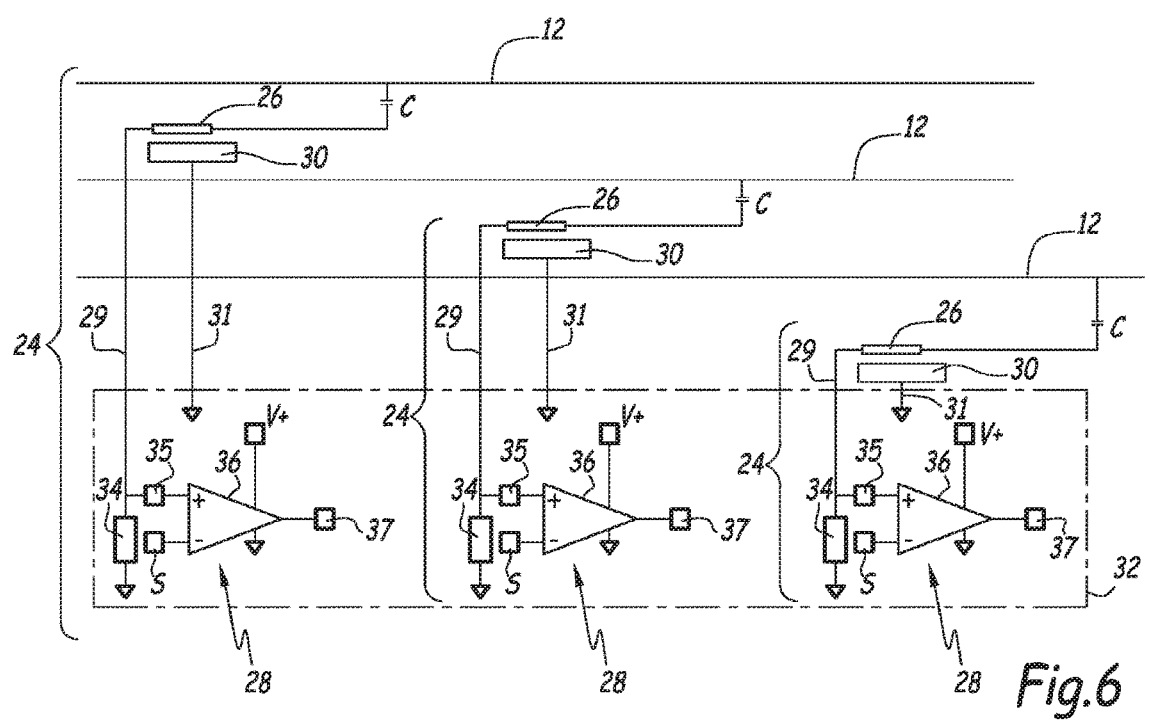
FIG. 6 is an equivalent diagram of a comparison circuit of the current sensor of FIGS. 3 to 5.

The comparison circuit 28 of the detection means 24 is able to compare the voltage detected by the measurement strip 26 with a predetermined threshold S value. The comparison circuit 28 is located in an external unit 32. A conductor 29 is configured for electrically connecting the measurement strip 26 to the comparison circuit 28 in the external unit 32. As illustrated in FIG. 6, the external unit 32 comprises the comparison circuits 28 of the three sensors 2. In parallel with the conductors 29, conductors 31 connect the shieldings 30 to an electric ground of the comparison circuits 28, which forms a zero volt point of the unit 32. The conductors 29 and 31 of each sensor 2 are integrated into a multi-conductor cable 33 which connects this sensor to the unit 32 and which comprises conductor(s) for transmitting the output signal of the measurement torus 22.

Figure 7:
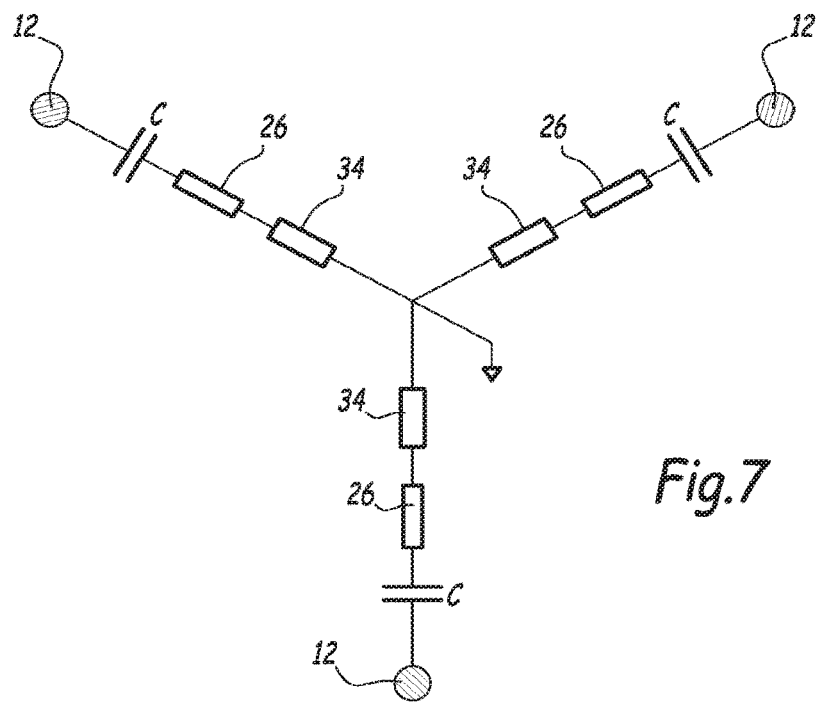
FIG. 7 is an equivalent diagram of a star coupling in the external unit.

Each comparison circuit 28 is an analog comparator. The analog comparator 28 comprises a measurement resistance 34, a module 35 for processing the signal and an operational amplifier 36. The strip 26, positioned at the distance D from the conductor 12, detects by induction a voltage signal, which is illustrated by a capacitance C on the electric diagram of FIG. 6. The voltage signal is transmitted to the comparator 28 via the conductor 29 and is measured by the measurement resistance 34. The measurement resistance 34 is itself connected to the zero volt point. This achieves a star coupling of the three measurement resistors 34 and of the three phases of the conductors 12, as illustrated in FIG. 7. The zero volt point is then an artificial neutral of the three-phased network 1.

The voltage signal is therefore sent to the processing module 35 which comprises a diode and an analog integrator, not shown in the figure. The diode plays the role of a rectifier, i.e. it transforms the voltage signal, which is an alternating signal, into a DC signal, by only letting through a positive component. The analog integrator gives the possibility of integrating the signal in order to reduce the variations thereof and to stabilize it. The voltage signal is then provided at the non-inverter input of the operational amplifier 36, which operates in a comparator mode and which is powered by a power supply voltage V+, typically 5 volt. The threshold S is notably a voltage value, typically 0.2 volts, and is provided to the amplifier 36 at the inverter input.

In a way known per se, the analog comparator 28 produces at the output a so-called high voltage value, of typically 5 volts, in the case when the detected voltage is greater than the threshold S. On the contrary, the comparator 28 produces at the output a so called low voltage value, typically 0 volts, when the detected voltage is less than the threshold S.

When the fuse 14 monitored by means of the sensor 2 melts, the means 24 detect a voltage substantially greater than the threshold S, which produces at the output of the comparator 28 the high voltage value. On the contrary, during normal operation of the network 1, the means 24 detect a voltage below the threshold S, which produces at the output of the comparator 28 the low voltage value.

The output of the comparator 28 is provided to a microprocessor 37 of the external unit 32. In practice, depending on the high or low output of the comparator 28, the external unit 32 is capable of generating a radio communication signal, notably according to an IEEE 802.11 protocol, in order to communicate the result of the comparison to a remote control unit 16 of the electric network 1.

Alternatively, the external unit 32 is further equipped with an optoelectronic component, such as a light-emitting diode, and is able to generate a communication light signal towards the control unit 16. The communication between the units 32 and 16 may also occur via a wired route.

The control unit 16 is thus configured for generating an alert in the case when melting of a fuse 14 of one of the branches 10 is detected by a sensor 2. The control unit 16 is also adapted for localizing the conductor 12 and the branch 10 where the melting of the fuse has occurred.

Figure 3:
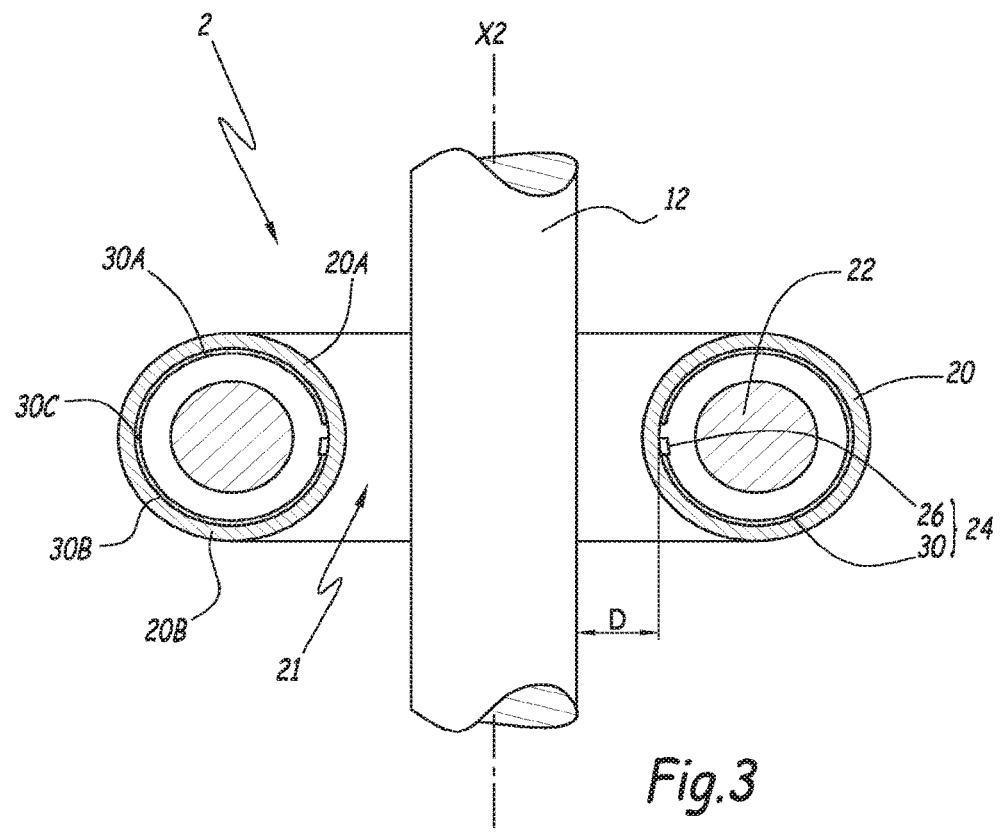
FIG. 3 is a schematic illustration of a current sensor according to the invention installed on an electric conductor.
Figure 4:
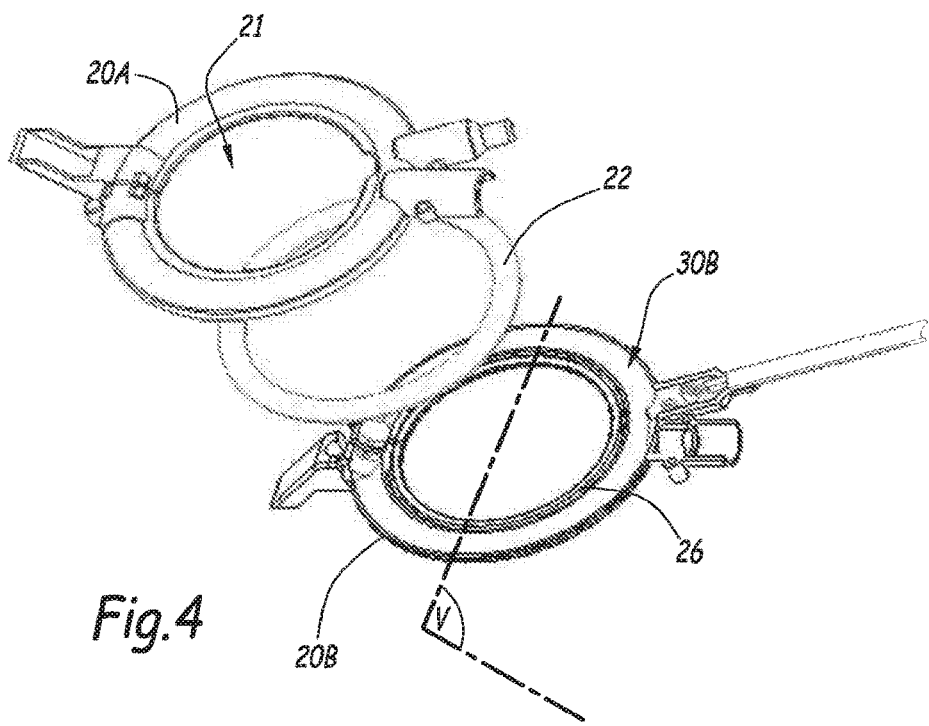
FIG. 4 is an exploded and perspective view of the sensor of FIG. 3.

The shielding 30 of the detection means 24 defines the electric ground of the detection means 24. As schematically illustrated in FIG. 3, the shielding 30 partly surrounds the measurement strip 26. A portion of the measurement strip 26 is directly facing the electric conductor 12, without interposition of the shielding 30. The shielding 30 thus surrounds radially the measurement strip 26 with respect to the central axis X2. The function of the shielding 30 is thus to electrically protect the detection means 24 and more particularly the measurement strip 26, from the possible parasitic currents induced by the neighboring conductors 12, so that the measurement strip only detects 26 the voltage of the conductor 12 which it surrounds.

Figure 8:
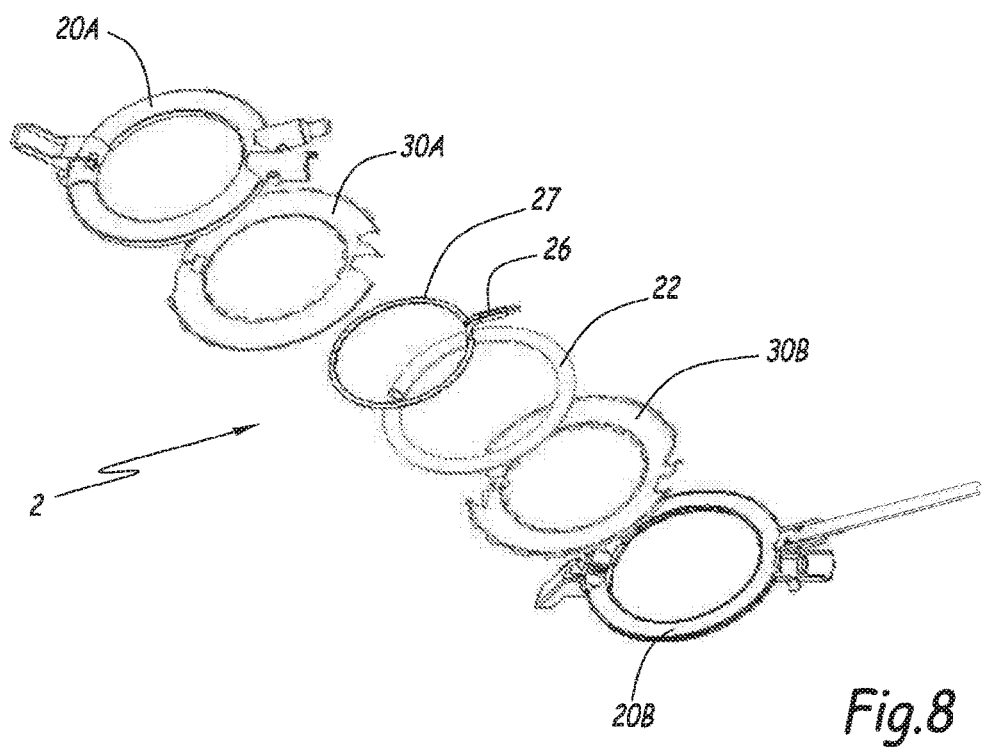
FIG. 8 is an exploded and perspective view of a current sensor according to a second embodiment of the invention.
Figure 9:
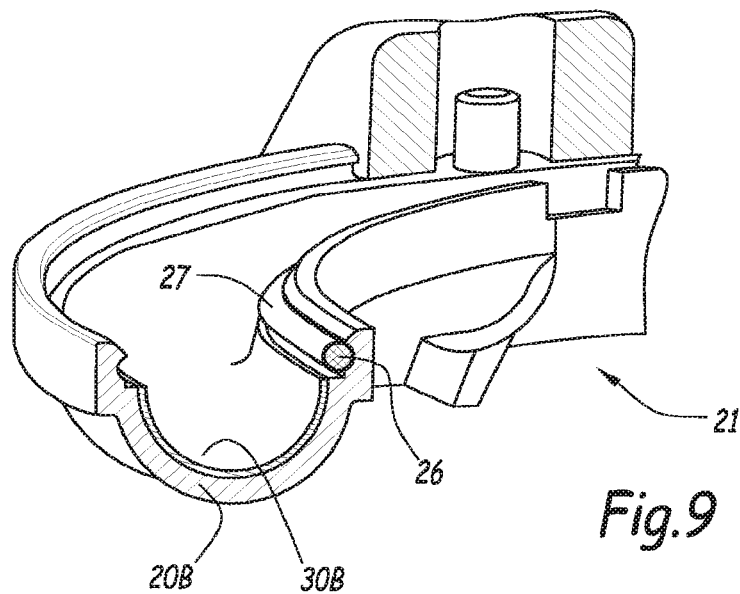
FIG. 9 is a sectional view similar to FIG. 5 for the current sensor of FIG. 8
Figure 10:
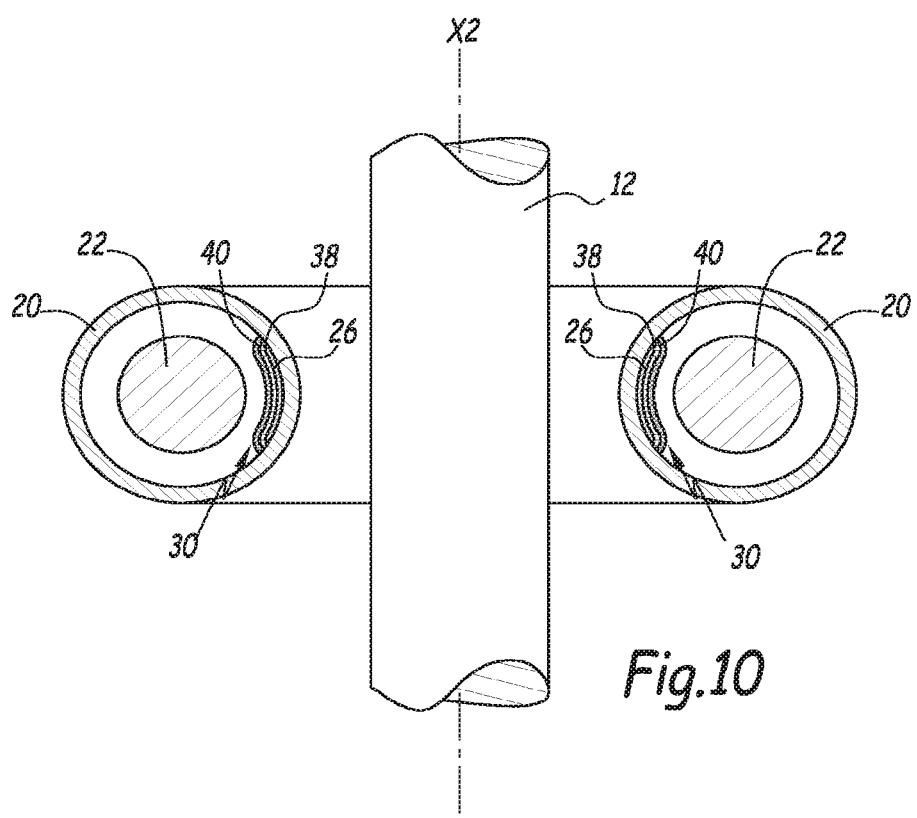
FIG. 10 is a figure similar to FIG. 3 for a current sensor according to a third embodiment of the invention.

FIGS. 8 to 10 show a second and third embodiment of the invention. The elements of these sensors 2 which are identical with those of the first embodiment bear the same references and they are not described in detail in so far that the description above may be transposed to these elements.

According to the second embodiment of the invention, illustrated in FIGS. 8 and 9, the measurement strip 26 is an electric conductor surrounded by an insulating sheath 27 itself adhesively bonded to the inside of the casing 20 and the shielding 30 is an over-molded plate (30A, 30B) inside the casing 20.

According to third embodiment of the invention, illustrated in FIG. 10, the measurement strip 26 is adhesively bonded inside the casing 20 of the sensor 2. The strip 26 is thus covered with a first layer 38 of insulating material and a second layer 40 of conducting material, notably metal, forming the shielding 30. In this case, and oppositely to both first embodiments, the shielding 30 is positioned radially inside the current sensor 22.

According to an alternative, which is not illustrated in the figures and may relate to all the embodiments mentioned above, the comparison circuit 28 comprises an analog-digital converter. In a way known per se, an analog-digital converter receives at the input the analog voltage signal emitted by the measurement strip 26 and at the output sends a digital signal which represents this voltage signal. The external unit 32 is then equipped with a microprocessor. The microprocessor is provided with a digital threshold S which is determined by a calculation, between a first maximum threshold value and a second minimum threshold value. In particular, the first maximum threshold value is defined according to the characteristics of the electric conductor 12 which the sensor 2 surrounds, as well on the rated electric current which the conductor 12 transmits. The second minimum threshold value is defined according to two adjacent electric conductors 12, i.e. depending on the parasitic currents induced by these adjacent conductors. The digital threshold S is determined for example as the average between the maximum value and the minimum value.

The embodiments and the alternatives contemplated above may be combined together for generating new embodiments.

The invention claimed is:

1. A current sensor comprising:
    a measurement torus, arranged in a casing positioned around an electric conductor able to transmit an electric current; and
    detection circuitry configured to detect a voltage in the electric conductor, the detection circuitry being constructed so as to surround the electric conductor when the current sensor is installed,
    wherein the detection circuitry includes:
        a measurement strip positioned at a non-zero distance from the electric conductor,
        a shielding which defines an electric ground of the detection circuitry, and
        a comparison circuit electrically connected to the measurement strip,
    wherein the measurement strip is arranged inside the casing, at an inner surface of the casing,
    wherein a portion of the measurement strip directly faces the electric conductor, without interposition of the shielding,
    wherein the shielding radially surrounds the measurement strip with respect to the central axis of the current sensor, and
    wherein the shielding is adjacent opposite edges of the measurement strip in a direction of a central axis of the current sensor.

2. The sensor according to claim 1, wherein the measurement strip is circular and centered on a central axis of the current sensor.

3. The sensor according to claim 1, wherein the comparison circuit includes an analog comparator configured to compare a voltage detected by the measurement strip with a predetermined analog threshold.

4. The sensor according to claim 1, wherein the comparison circuit includes an analog/digital converter configured to transmit a voltage detected by the measurement strip to an external microprocessor equipped with a predetermined digital threshold.

5. The sensor according to claim 1, wherein the measurement strip is a metal track adhesively bonded inside the casing of the current sensor or a conductor surrounded by an insulating sheath.

6. The sensor according to claim 1, wherein the shielding is formed with a metallization layer affixed onto the inner surface of the casing of the current sensor or is an over-molded plate inside the casing.

7. The sensor according to claim 1, wherein the measurement strip is adhesively bonded inside the casing of the current sensor and covered with a first layer of insulating material and a second layer of conducting material forming the shielding.

8. An electric network including:
    three electric conductors, each said electric conductor being configured to transmit one phase of an electric current and equipped with a current sensor, and
    a remote control unit,
    wherein each said current sensor is according to claim 1.

9. The electric network according to claim 8, wherein a threshold of the comparison circuit of each said current sensor is determined by calculation, between a first maximum threshold value, defined according to one of the electric conductors, of the three electric conductors, surrounded by said current sensor, and a second minimum threshold value, defined according to two adjacent electric conductors of the three electric conductors.

* * * * *